United States Patent [19]
Moyer et al.

[11] Patent Number: 4,801,765
[45] Date of Patent: Jan. 31, 1989

[54] ELECTRONIC COMPONENT PACKAGE USING MULTI-LEVEL LEAD FRAMES

[75] Inventors: Harold W. Moyer, Allentown; Harry R. Scholz, Macungie, both of Pa.

[73] Assignee: American Telephone and Telegraph Company, AT&T Bell Laboratories, Murray Hill, N.J.

[21] Appl. No.: 816,443

[22] Filed: Jan. 6, 1986

[51] Int. Cl.⁴ .............................................. H01L 23/02
[52] U.S. Cl. ...................................... 174/52.4; 29/827
[58] Field of Search ................... 174/52 FP, 52 PE; 357/70; 361/421; 29/827, 588; 439/736, 874

[56] References Cited

U.S. PATENT DOCUMENTS

| | | | |
|---|---|---|---|
| 3,271,625 | 9/1966 | Caracciolo | 174/52 FP |
| 3,676,748 | 7/1972 | Kobayashi et al. | 361/421 |
| 4,105,861 | 8/1978 | Hascoe | 174/52 FP |
| 4,380,042 | 4/1983 | Angelucci, Sr. et al. | 361/421 |
| 4,477,828 | 10/1984 | Scherer | 357/80 |
| 4,496,965 | 1/1985 | Orcutt et al. | 357/70 |
| 4,498,122 | 2/1985 | Rainal | 361/414 |
| 4,542,259 | 9/1985 | Butt | 174/52 FP |
| 4,579,404 | 4/1986 | Lockard | 439/874 |
| 4,602,831 | 7/1986 | Lockard | 439/736 |
| 4,677,526 | 6/1987 | Muehling | 174/52 FP |

Primary Examiner—Arthur T. Grimley
Assistant Examiner—D. A. Tone
Attorney, Agent, or Firm—Lester H. Birnbaum

[57] ABSTRACT

Disclosed is a semiconductor package with a high pin count. External contacts to the chip are provided by interdigitated leads formed from an upper and lower lead frame. The lower lead frame includes a paddle for mounting the chip. The upper lead frame initially has its leads tied together and a center portion is punched out to fit the size of the particular chip. The two lead frames are preferably coplanar in the area around the boundaries of the package encapsulant.

18 Claims, 4 Drawing Sheets

ELECTRONIC COMPONENT PACKAGE USING MULTI-LEVEL LEAD FRAMES

BACKGROUND OF THE INVENTION

This invention relates to electronic component packages and in particular to packaging semiconductor chips which require a high density of external electrical connections.

At the present time, the standard method of assembling postmolded plastic integrated circuit packages begins with a lead frame. The lead frame may be visualized as a solid metal picture frame with slender fingers radiating inward from either two opposing sides or from all four sides toward the geometric center of the picture frame. Also radiating inward from each of the four corners of the picture frame is a slender finger which terminates on a square or rectangular piece of metal, typically referred to as a paddle, which occupies a portion of the area around the geometric center. The chip is first epoxied to the paddle and then electrically connected to the lead frame by wire bonds which originate at the contact pads on the chip and terminate on the fingers. It should be noted that the lead frame fingers stop short of contacting the paddle in order to electrically isolate the two entities. The chip and a portion of the lead frame fingers are then encapsulated, or molded, in a material such as an epoxy or plastic molding compound. Finally, the molded package body and lead frame fingers are excised from the metal picture frame portion of the lead frame. The lead frame fingers are then formed to provide a means of electrically connecting the integrated circuit package to the second level interconnection board (see, e.g., U.S. Pat. No. 4,048,670 issued to Eysermans).

The standard packaging scheme has been generally satisfactory. However, the increasing complexity of dsign and function of single chips, such as microprocessors, has required a higher density of chip contact pads and consequently, higher I/O connections for the packaged device. In order to meet the need for packages requiring a high contact pad density, workers in the art have generally relied upon multi-level ceramic or glass packages (see, e.g., U.S. Pat. No. 4,498,122 issued to Rainal). While adequate, such packages are fairly expensive.

It is therefore a major object of the invention to provide a small and inexpensive semiconductor chip package that can accommodate chips with a high contact pad density.

SUMMARY OF THE INVENTION

This and other objects are achieved in accordance with the invention which, in one aspect, is an encapsulated electronic component package comprising an electronic component, a first level of conductive leads electrically coupled to associated contact areas on the component, and a second level of conductive leads disposed above the leads of the first level in an area proximate to said component and electrically coupled to associated contact areas on the component, said leads extending from an area proximate to said component to an area outside the encapsulant.

In accordance with another aspect, the invention is a method of forming an electronic component package. A first lead frame is provided which includes a portion for mounting a component and conductive leads extending radially inward from the perimeter to an area proximate the mounting portion. A second lead frame is provided which includes conductive leads extending radially inward from the perimeter. The end of each lead occupying the central portion of the second lead frame is removed in accordance with the size of the component to be packaged. The second lead frame is disposed with respect to the first lead frame so that the conductive leads of the second lead frame are located at a level above the conductive leads of the first lead frame in the area proximate to the mounting portion.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
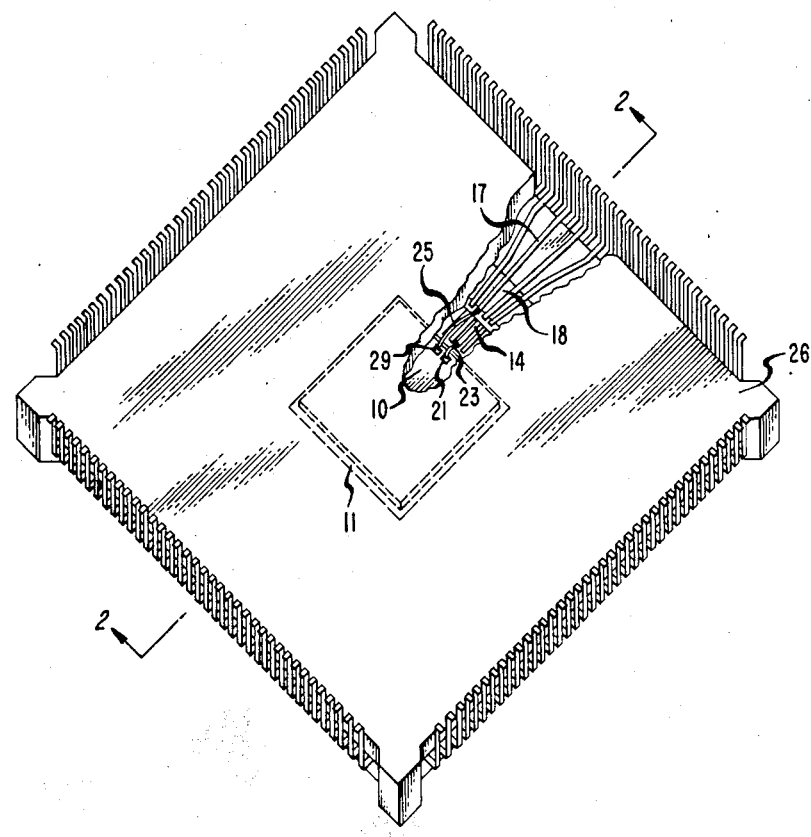
FIG. 1 is a partly cut-away perspective view of a component package in accordance with one embodiment of the invention.
Figure 2:
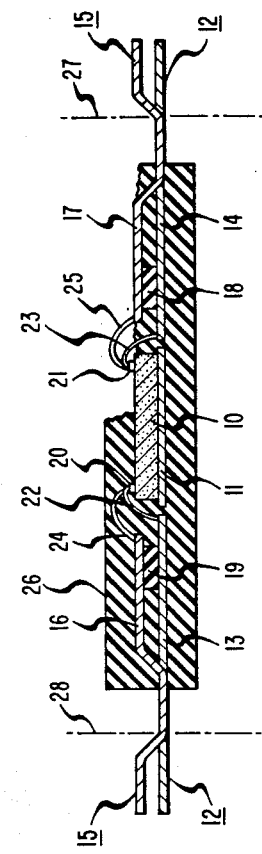
FIG. 2 is a cross-sectional view of the package along line 2—2 of FIG. 1.

The basic features of the invention will be described with reference to the embodiment illustrated in the perspective and cross-sectional views of FIGS. 1 and 2, respectively. An electronic component, such as a standard silicon semiconductor chip, 10, which in this example is a microprocessor chip, was mounted on a paddle, 11, which makes electrical contact to the back side of the chip. The paddle is part of the lower lead frame, 12 (see FIG. 3), which also includes a plurality of leads such as 13 and 14 radiating inward from the solid picture-frame-like perimeter to the vicinity of the chip. In this example, the lower lead frame has leads extending to all four sides of the chip, but the invention is also applicable to packages where the leads extend to only one side or two sides of the chip, generally known in the art as single-in-line and dual-in-line packages, respectively. Of course, packages with leads extending to all four sides (quad packages) provide the maximum density of external electrical connection.

The package further includes an upper lead frame, 15, with leads such as 16 and 17, radiating inward from the said picture-frame-like perimeter to the area proximate the chip, though generally not as far as the leads, 13 and 14, of the lower lead frame. The leads of the upper lead frame lie above the leads of the lower lead frame at least in the area proximate to the chip. The leads of the upper lead frame are also preferably interdigitated with those of the lower lead frame, i.e., the upper leads lie in the spaces between the lower leads though in a higher plane.

The leads of both lead frames are self-supporting as is typical in molded plastic assemblies. That is, the leads are not deposited on any material or substrate and maintain their individual positions and shape without any support other than the lead frame itself. However, it is desirable to insure that the upper and lower leads remain physically separate and so spacers, 18 and 19, of an insulating material are provided essentially parallel to each side of the chip between the upper and lower leads. In this example, the spacers were strips of a double-sided adhesive insulating tape, such as that sold by Amicon under the designation TG-86, which were placed on the leads of the lower lead frame.

The upper surface of the chip, 10, includes a plurality of contact areas or bond pads, depicted as 20, 21, and 29, that are typically distributed along all four sides of the device. These contact areas are electrically interconnected to the chip circuitry by means of metallized runners (not shown) and serve as the point of external electrical connection to the circuitry. Each contact area was electrically connected to one of the leads of the upper or lower lead frame by wires, such as wires 22 and 23 which connect pads 20 and 21 to leads 13 and 14, and wires 24 and 25 which connect adjacent pads to leads 16 and 17 (one of which is shown in FIG. 1 as pad 29).

The semiconductor chip and a portion of the leads were encapsulated within a standard encapsulant, 26, which in this example was an epoxy molding compound. It will be noted, as shown in FIG. 2, that a portion of the leads of the upper lead frame is made coplanar with the leads of the lower lead frame. This portion extends from an area removed from the semiconductor chip but within the encapsulant, 26, to an area extending outside the boundary of the encapsulant. The length of the coplanar portions will depend upon the desired length of the pins in the final package, since it is desirable to separate the leads from the lead frame along lines such as 27 and 28 in the coplanar portions to keep all pins the same length. The provision for coplanar portions is also advantageous in permitting a uniform clamping of the lead frames at the boundaries of the encapsulant. (It will be appreciated that for purposes of illustration FIG. 2 shows the lead frame assemblies prior to separating the leads from the frame and forming the leads into their final configuration, while FIG. 1 shows the completed package.)

In this particular package, the chip, 10, measured approximately 0.400×0.375×0.020 inches and had a different number of contact pads ranging from 22 to 43 on each side. Each lead had a length of approximately 0.420 inches from the perimeter to the edge near the chip and a thickness of approximately 0.006 inches. The coplanar portion of the upper and lower leads was approximately 0.140 inches in length. The size of the package, as defined by the dimensions of the encapsulant was 1.070×1.070×0.110 inches and each lead extending from the package was 0.100 inches long. The leads of the lower lead frame extended to approximately 0.02 inches from the edge of the chip (0.01 inches from the paddle edge) and the leads of the upper lead frame extended to approximately 0.05 inches from the edge of the chip (0.04 inches from the paddle).

It will be appreciated that this package, in contrast to multi-layer ceramic packages, provides electrical contacts to the chip pads by means of leads which are an integral part of the final package. That is, the leads extend from an area proximate to the chip within the encapsulant to an area outside the encapsulant where they can make contact to external circuitry such as a printed wiring board.

Figure 3:
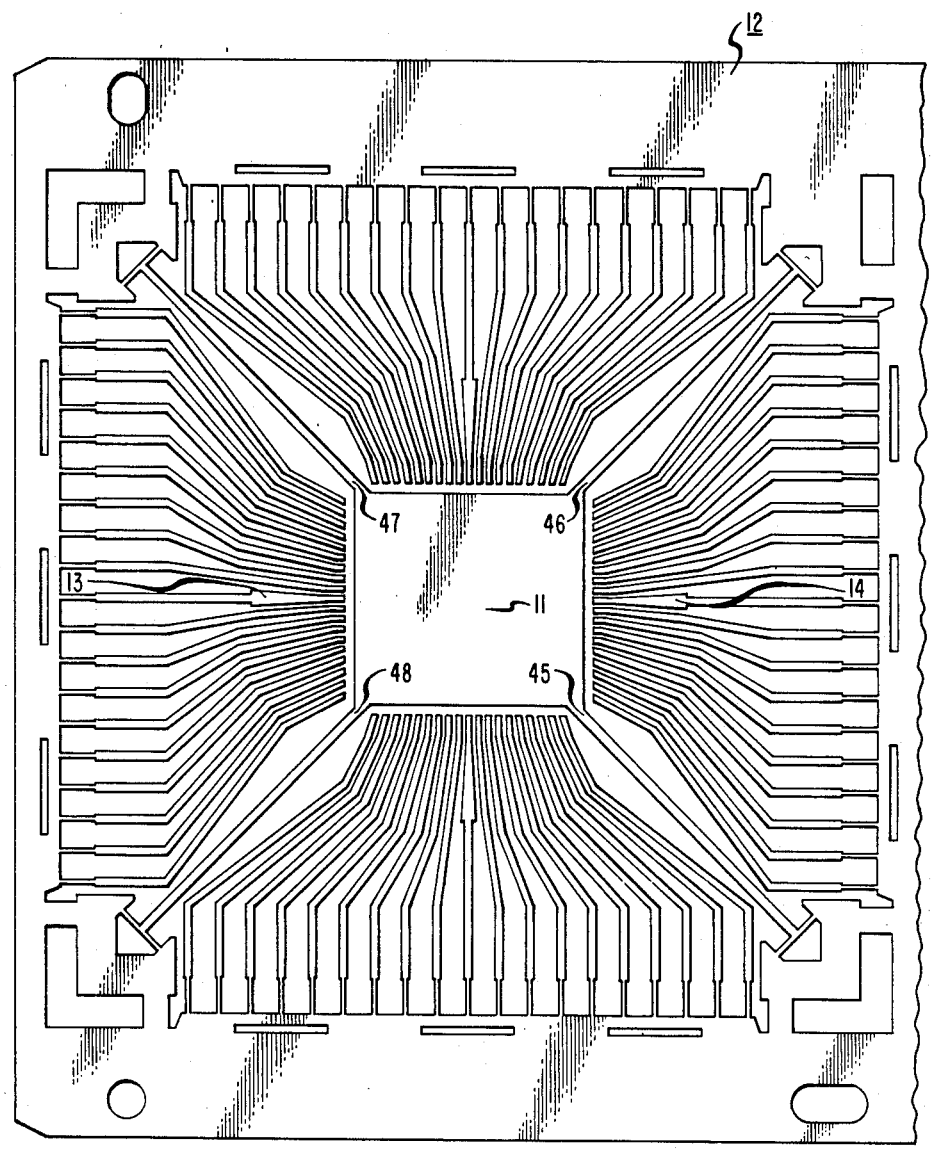
FIG. 3 is a plan view of a first lead frame used in the fabrication of the package of FIGS. 1 and 2.

In order to fabricate such a package, a standard lead frame such as that shown in the plan view of FIG. 3 was provided. (Elements corresponding to those in FIGS. 1 and 2 are similarly numbered.) This lead frame represents the lower lead frame of the package and it includes, as a mounting portion for the chip, a paddle 11 which is interconnected to paddle support leads 45-48. The chip was mounted to the paddle by a conductive epoxy.

Figure 4:
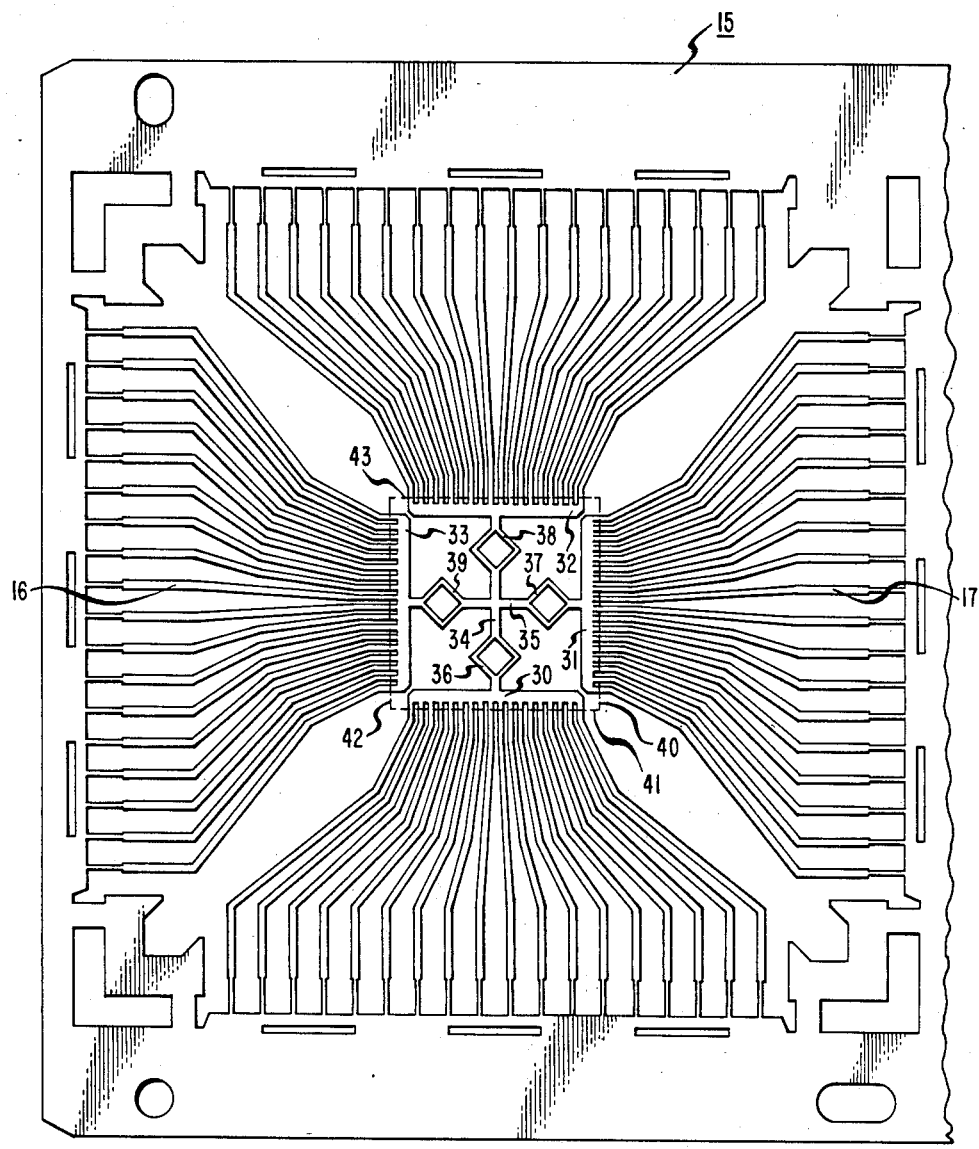
FIG. 4 is a plan view of a second lead frame used to fabricate the package of FIGS. 1 and 2.

The upper lead frame of the package appears initially as shown in FIG. 4. All the leads, such as 16 and 17, which extend from the picture-frame-like perimeter are initially tied together by tiebars 30-33 and crossbars 34 and 35. Included in the crossbars are expansion joints 36-39 to allow for possible differential motion of leads on a particular side during processing of the lead frame. The upper lead frame is initially flat, and the final shape (see FIG. 2) is achieved by first bending all the leads downward to the level of what will be the coplanar portions of the final assembly. The central portion of the fingers is then bent upward in such a manner that they will be parallel to, and positioned at the desired height above, the lower lead frame. This can be done by standard metal-working techniques.

Following the shaping of the leads of the upper lead frame assembly, the leads are separated from each other by punching out the central portion of the assembly which includes the tiebars, crossbars, expansion joints, and a portion of the end of each lead. In this example, the boundary of the cut-out portion is represented by the dashed lines 40-43. It will be appreciated that this upper lead frame can be used for a chip of any size by cutting off an appropriate length of each lead at the central region of the assembly.

Strips of insulating material (see FIG. 2) which act as spacers, 18 and 19, can be placed on the lower lead frame of FIG. 3, before or after mounting the chip. However, in order to prevent possible damage to the chip, it is desirable to deposit the strips before mounting the chip. The upper lead frame of FIG. 4 is then oriented over the lower lead frame of FIG. 3 so that the leads of the upper frame are aligned with their associated contact pads on the chip while resting on the spacers at a position above the leads of the lower assembly. At the same time, the downwardly bent portions of the upper lead frame fall within the spaces of the leads of the lower lead frame. The upper and lower leed frames can be aligned by means of alignment markers or by means of alignment holes as shown in FIGS. 3 and 4. While held in the aligned position, the frames are permanently fastened together at the perimeter by some means, e.g., welding, soldering, contact cement, etc., to form a lead frame assembly. Wire contacts are then formed between each contact pad and its associated lead by standard wire bonding. The assembly can then be encapsulated by standard techniques and materials such as transfer molding with an epoxy molding compound. Finally, the leads can be separated from the frame by standard cutting operations, and then formed approximately 90 degrees to provide a desired standoff height, followed by another 90 degree bend to produce the foot on which the package rests.

While the invention has been described with regard to packaging a particular semiconductor chip, it will be appreciated that the concepts can be utilized for any semiconductor chip having a high density of contact areas on a side (especially for those devices with a contact pad center-to-center spacing of 0.008 inches or less). In addition, the invention may be used for packaging hybrid integrated circuits or other electrical components. Furthermore, additional lead frames could be provided for certain needs. For example, a third lead frame functioning as a ground plane could be provided beneath the lower lead frame (12) shown in the figures.

A third lead frame might also be provided to further reduce the center-to-center spacing of the leads.

Various additional modifications of the invention will become apparent to those skilled in the art. All such variations which basically rely on the teachings through which the invention has advanced the art are properly considered within the scope of the invention.

What is claimed is:

1. An encapsulated semiconductor chip package comprising:
    a semiconductor chip with contact areas on a surface thereof;
    a first level of conductive leads electrically coupled to associated contact areas on the chip;
    a second level of conductive leads disposed above the leads of the first level in an area proximate to said chip and electrically coupled to associated contact areas; and
    a molded material encapsulating the semiconductor chip and a portion of said leads so that the leads extend from an area proximate to said chip within the molded material to an area outside the molded material.

2. The device according to claim 1 wherein the leads of the first and second level are formed from lead frames disposed one above the other.

3. The device according to claim 1 further comprising spacing elements disposed between the upper and lower level of leads.

4. A semiconductor chip package comprising:
    a semiconductor chip having contact pads with a center-to-center spacing of 0.008 inches or less on each side of a major surface thereof;
    a first level of conductive leads formed from a first lead frame and electrically coupled to associated contact pads on the chip;
    spacer elements formed on said first level of leads;
    a second level of conductive leads formed from a second lead frame disposed above the first lead frame, the leads of the second level being separated from the leads of the first level by the spacer elements in an area proximate to said chip and being interdigitated with the leads of the first level, said leads also being electrically coupled to associated contact pads on the chip, each of said leads of the second level further having a portion which is coplanar with the leads of the first level; and
    a molded material formed around the chip and a portion of the leads, said material extending to the coplanar portions of the leads.

5. A method of forming an electronic component package comprising the steps of:
    providing a first lead frame including a portion for mounting a component and conductive leads extending radially inward from a perimeter of the frame to an area proximate the mounting portion;
    providing a second lead frame with conductive leads extending radially inward from a perimeter of the frame, the end of each lead occupying a central portion of the frame;
    removing a portion of each lead from the second lead frame in the central portion according to the size of the component; and
    subsequent to removing said portion from the second lead frame, disposing the second lead frame with respect to the first lead frame so that the conductive leads of the second lead frame are located at a level above the conductive leads of the first lead frame in the area proximate to the mounting portion.

6. The method according to claim 5 wherein a portion of the leads of the second lead frame is bent and the second lead frame is then disposed above the first lead frame so that this portion is coplanar with the leads of the first lead frame.

7. The method according to claim 5 wherein, prior to removal of a portion of each lead, the leads of the second lead frame are mechanically tied together at the central portion of the lead frame and this tie is cut out along with a desired amount of each lead.

8. The method according to claim 5 wherein each lead frame has leads extending to the area proximate to the mounting portion on all four sides thereof.

9. The method according to claim 5 further comprising the steps of mounting a semiconductor chip with contact areas on a surface thereof to the mounting portion and providing electrical contact between the contact areas and associated leads of both lead frames.

10. The method according to claim 5 further comprising the step of depositing spacer elements on the leads of the first lead frame.

11. The method according to claim 5 wherein the leads of the second lead frame are interdigitated with the leads of the first lead frame.

12. The method according to claim 5 wherein a first portion of the leads of the second lead frame remote from the central portion is bent in one direction and a second portion of the leads in the area proximate to the central portion is bent in an opposite direction, and the second lead frame is disposed above the first lead frame so that the portion of the leads between the first and second portions is coplanar with the leads of the first lead frame.

13. A method of forming a semiconductor package comprising the steps of:
    providing a first lead frame including a portion for mounting a semiconductor chip at a central portion and conductive leads extending radially inward from a perimeter of the frame to an area proximate the mounting portion on all four sides thereof;
    providing a second lead frame with conductive leads extending radially inward from the perimeter of the frame to a central portion on all four sides where the leads are mechanically coupled together at the central portion;
    bending a first portion of the leads of the second lead frame remote from the central portion in one direction and a second portion of the leads in an area proximate to the central portion in an opposite direction ;
    cutting out the central portion of the second lead frame along with the selected portion of each lead according to the size of the semiconductor chip;
    subsequent to the bending and the cutting of portions of the second lead frame, disposing the second lead frame above the first lead frame so that the leads of the second lead frame are located above and interdigitated with the leads of the first lead frame in the area proximate to the mounting portion while the portions of the leads of the second lead frame between the first and second portions are coplanar with the leads of the first lead frame at an area removed from the mounting portion;
    mounting a semiconductor chip with contact areas on a surface thereof to the mounting portion;

electrically connecting said contact areas to associated leads of the two lead frames; and encapsulating the chip and a portion of the leads up to the coplanar portions of the leads of the two lead frames with a molded material.

14. A semiconductor chip package comprising:

a semiconductor chip with contact areas on a surface thereof;

a first level of conductive leads electrically coupled to associated contact areas on the chip;

a second level of conductive leads disposed above the leads of the first level in an area proximate to said chip and electrically coupled to associated contact areas on the chip, each of the leads of the second level including a portion which is coplanar with the leads of the first level; and a molded material encapsulating the semiconductor chip and a portion of the leads, said material extending to the coplanar portions of the leads.

15. The device according to claim 8 wherein the chip has contact pads with a center-to-center spacing of 0.008 inches or less.

16. The device according to claim 14 wherein the component and a portion of the leads are encapsulated in a molded material which extends to the coplanar portion of the leads of the two levels.

17. The device according to claim 14 wherein the leads of the upper level are interdigitated with those of the lower level.

18. The device according to claim 14 wherein the leads extend to an area proximate to said component on all four sides of said component.

* * * * *